United States Patent

Corman et al.

Patent Number: 5,253,484
Date of Patent: Oct. 19, 1993

[54] HIGH RELIABILITY AVIONIC COOLING SYSTEM

[75] Inventors: Randal A. Corman, Renton; Terry R. Waldron, Maple Valley, both of Wash.

[73] Assignee: The Boeing Company, Seattle, Wash.

[21] Appl. No.: 748,429

[22] Filed: Aug. 22, 1991

[51] Int. Cl.⁵ .................................................. B60H 3/06
[52] U.S. Cl. ........................................ 62/239; 454/76; 62/DIG. 5; 62/259.2
[58] Field of Search ............... 62/239, 241, 243, 404, 62/DIG. 5; 454/70, 71, 72, 76, 77

[56] References Cited

U.S. PATENT DOCUMENTS

| | | | |
|---|---|---|---|
| 2,336,671 | 12/1943 | Chambers | 62/115 |
| 2,963,879 | 12/1960 | de Paravicini | 62/239 |
| 2,966,047 | 12/1960 | de Paravicini | 62/335 |
| 3,711,044 | 1/1973 | Matulich | 244/118 P |
| 4,484,449 | 11/1984 | Muench | 62/79 |
| 4,653,532 | 3/1987 | Powers | 137/563 |
| 4,741,255 | 5/1988 | Lancaster | 454/71 |
| 4,966,005 | 10/1990 | Cowell et al. | 62/79 |

FOREIGN PATENT DOCUMENTS

799972 1/1981 U.S.S.R. .

*Primary Examiner*—Albert J. Makay
*Assistant Examiner*—William C. Doerrler
*Attorney, Agent, or Firm*—Glenn D. Bellamy

[57] ABSTRACT

A high reliability cooling system for avionics provides a low-weight tertiary backup. A first source of cooling airflow (20) is directed through a first duct (28) to a first compartment (30, 32). A second source of cooling airflow (58) is directed through a second duct (68) to a second compartment (70, 74, 76, 78). A check valve (104) is located in the first duct (28) and permits airflow from said first source (20) to said first compartment (30, 32) and prevents a back-flow of air therethrough. An interconnecting duct (84) is provided between the first and second ducts (28, 68). The interconnecting duct (84) connects to the first duct (28) at a location between the check valve (104) and the first compartment (30). A shutoff valve (86) is located in the interconnecting duct (84) and is operable to open or close airflow therethrough. The invention provides three modes of operation. First, with the shutoff valve (86) closed, there are two separated avionic cooling systems. Second, in the event of failure of the second source cooling airflow (58), the shutoff valve (86) can be opened to allow the first source (20) to provide cooling airflow to all avionics. Third, in the event of failure of the first source of cooling airflow (20), the shutoff valve (86) can be opened and the second source (58) can supply cooling airflow to all critical avionics. The check valve (104) segregates airflow in this mode between critical and non-critical avionics.

13 Claims, 2 Drawing Sheets

HIGH RELIABILITY AVIONIC COOLING SYSTEM

DESCRIPTION

Technical Field

This invention relates to a high reliability cooling system, especially such a system used for cooling aircraft electronic equipment in which a tertiary backup system is required.

Background

Commercial aircraft typically incorporate a duct system for supplying cooling air to onboard electronic equipment. The cooling air is drawn from a variety of sources, depending on aircraft operating conditions at any given time, and may directly or indirectly recirculate cooling air.

In a typical commercial passenger airplane, a single cooling air supply system may be used. In a commercial airplane designed for carrying package freight, there is a need to isolate airflow between the flight deck area and the cargo area. This is necessary in order to prevent smoke or fumes from entering the fight deck in the event that there is an inflight fire in the cargo compartment. Because avionics deemed necessary to safe flight and landing are located in both the flight deck compartment and cargo area, a single cooling system is not normally used.

FAA regulations require that such critical systems have backup or redundant cooling sources so that total failure will be "extremely improbable." In airplanes restricted to operation within one hour of an alternate airport, such systems may require simply a backup supply fan for use in the event the primary supply fan fails. Extended range operation requires triple redundancy in order to make total failure "extremely improbable." The addition of a third backup fan for each cooling system is unacceptable because of the added weight and cost, and because it would make no provision for backup in the event of failure due to complete lack of power to one system. The use of cabin differential pressure or rerouting of air conditioning airflow as a third source for cooling is unacceptable due to their impacts on other aircraft systems, especially during emergency situations.

SUMMARY OF THE INVENTION

The present invention provides a cooling system in an aircraft having a plurality of compartments to be cooled. The system includes a first source of cooling airflow directed through a first duct to a first compartment and a second source of cooling airflow directed through a second duct to a second compartment. A check valve in the first duct permits flow from the first source of cooling airflow to the first compartment and prevents a back-flow of air therethrough. An interconnecting duct extends between the first and second ducts. The interconnecting duct connects to the first duct at a location between the check valve and the first compartment. A shutoff valve is located in the interconnecting duct and is operable to open or close airflow therethrough.

In preferred form, the first and second sources of cooling airflow include electric fans, and each may include a second fan for use as a secondary backup in the event of failure of the primary fan. Also in preferred form, the first duct may include a plurality of branches, with the check valve being located in one of the branches. The first compartment may include separate regions to which cooling air is supplied by separate branches of the first duct. In such an embodiment, the interconnecting duct connects with a branch between the check valve and the associated region of the first compartment.

In use, each source of cooling air may have a secondary backup in the form of an auxiliary fan. In the event of failure of both fans of either airflow source or loss of power to either airflow source, the shutoff valve in the interconnecting duct can be opened so that cooling air may be supplied to critical avionics in an emergency situation by the remaining source of cooling airflow.

The first compartment may be segregated into regions, at least one of which contains avionics deemed necessary to safe flight and landing of the airplane. During an emergency situation in which the first source of cooling air fails, the shutoff valve can be opened and the second source of cooling air will supply airflow through the interconnecting duct and to a region of the first compartment containing the critical avionics. Airflow into other branches of the first duct is prevented by the check valve.

It is an object of the present invention to provide a low-weight, triple-redundant cooling system to two sets of critical avionics, while maintaining cooling system isolation required for smoke control.

Further objects, features, benefits and details of the present invention may be found in the drawings, appended claims, and following description of the best mode for carrying out the invention, all of which comprise disclosure of the present invention.

BRIEF DESCRIPTION OF THE DRAWINGS

Like reference numerals are used to indicate like parts throughout the various figures of the drawing, wherein.

BEST MODE FOR CARRYING OUT THE INVENTION

Figure 1:
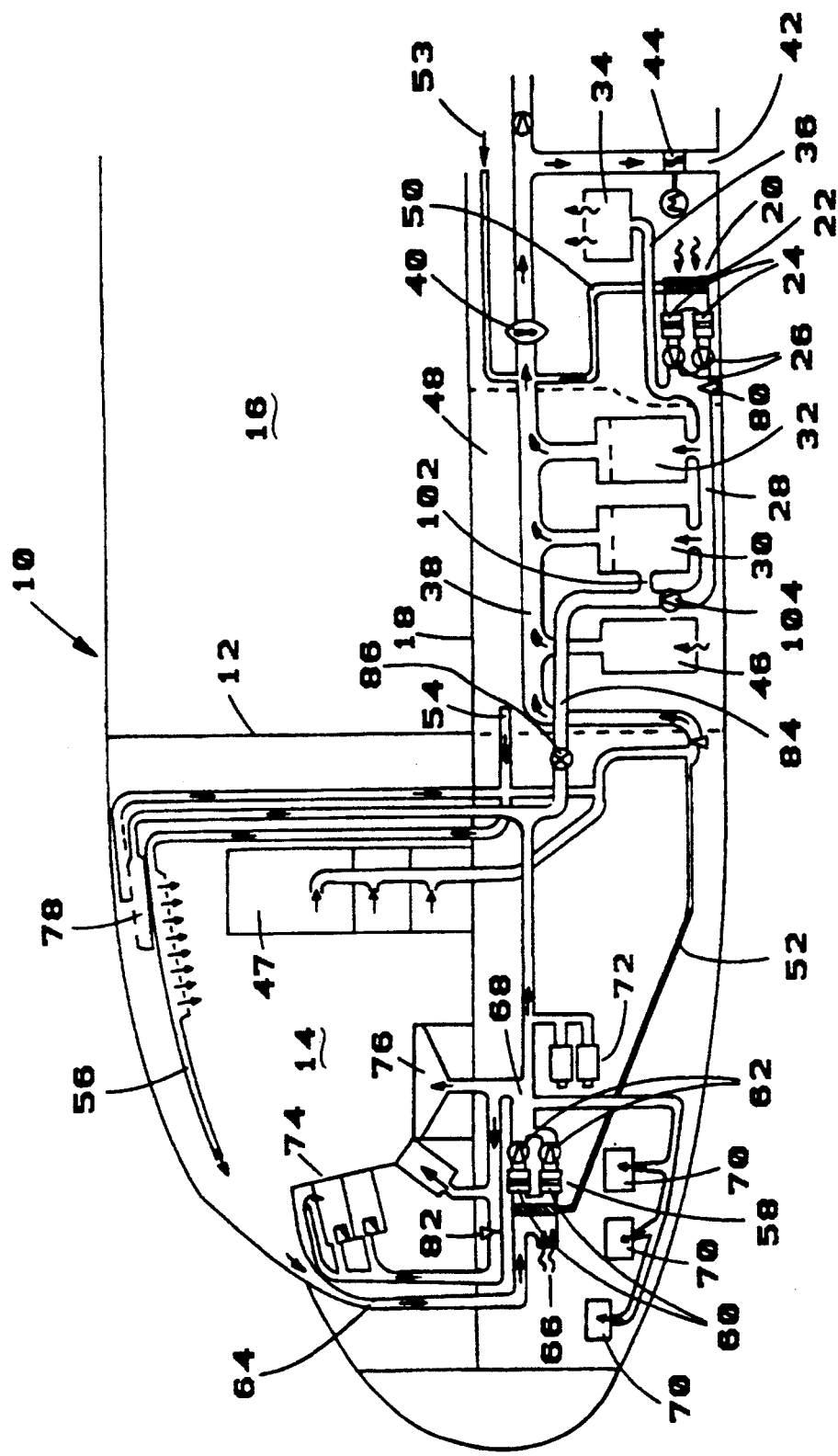
FIG. 1 is a schematic representation illustrating dual cooling systems in an aircraft constructed according to the preferred embodiment of the present invention.

Referring to the various figures of the drawing, and first to FIG. 1, therein is shown at 10 a schematic representation of a front portion of a commercial freighter airplane. The body of the plane is divided by a barrier Wall 12 into a flight deck compartment 14 and cargo bay area 16. Each of these areas is divided into upper and lower lobes by the floor 18.

As used herein, the term "avionics" generally relates to electrical and electronic equipment carried on board an aircraft. As is common with such equipment, heat is generated which must be removed for proper functioning of the equipment.

Typically, the cooling system which supplies cooling air to avionics is not refrigerated, but rather simply moves ambient air drawn from the flight deck or other areas through avionic equipment or equipment racks.

Shown at 20 is a main avionics cooling system including an air cleaner 22, dual supply fans 24, and dual check valves 26, one associated with each of the supply fans 24, to prevent back-flow of air while either of the fans 24 is inoperable. The main cooling system 20 supplies cooling air into various ducts 28, 36 leading to compartments or racks 30, 32, 34 of avionic equipment. Some avionics compartments or racks (such as illustrated at 34) have cooling air supplied through a duct 34 which is then vented to ambient space surrounding the compartment 34. Others (such as illustrated at 30, 32) may have some or all of the cooling airflow recirculated through a recirculation duct 3B. Air may be drawn through this duct 38 either by a recirculation fan 40 or by suction created through an overboard venturi 42 and controlled by a motor-operated overboard exhaust valve 44. Some avionics compartments or racks 46, 47 may be cooled simply by the drawing of ambient air from the equipment compartment 48 through the recirculation duct 38. The recirculation duct 38 also draws air from air-cleaner purge lines 50, 52, from smoke detector lines 53, and from air supplied to the flight deck through air conditioning system ducts 54, 56.

In a passenger airplane, the main cooling system 20 would supply cooling airflow to avionics located in the flight deck area 14, as well as those in the forward equipment compartment 48 of the cargo deck 16. However, in a package cargo freighter airplane, it is important to isolate or prevent airflow between flight deck area 14 and cargo area 16 in the event of onboard smoke or fire. For this reason, a second, flight deck avionics cooling system 58, including dual supply fans 60 and associated check valves 62, is required.

As in the previously-described main system 20, the flight deck system 58 includes redundant supply fans 60 such that the system can switch automatically from a primary fan to a secondary fan, in the event of primary fan failure. As previously described, the check valve 62 associated with each fan 60 will prevent back-flow of air through either fan 60 which is not in operation. The forward system 58 may draw air from either a recirculation duct 64 or from ambient air 66. The system 58 delivers cooling air through a network of ducts 68 which are connected with smoke detectors 72, avionics compartments or racks ? 0 in the lower lobe of the flight deck, and forward instrument panels 74, center aisle stand 76 and overhead instrument panels 78 in the upper flight deck.

Both cooling systems 20, 58 are designed to operate on a single supply fan 24, 60. In the event of fan failure, a low flow detector 80, 82 in the supply duct 28, 68, or other detector system will notify the pilot that a secondary supply fan 24, 60 is being activated. Because extended range flight requires that a complete failure of a cooling system 20, 58 be "extremely improbable," each system 20, 58 must have a tertiary, or triple redundant, backup to provide sufficiently high reliability. Adding a third fan, check valve, and associated ducting to each system would add undesirable weight and expense to the aircraft 10. Also, this would provide no backup in the event of a complete power failure to either one of the systems 20, 58. The emergency electrical system also may have insufficient capacity to provide power to two separate fans 24, 60 in the event of main generator failure. Use of cabin differential pressure or air conditioning air as a third source for avionic cooling is not workable due to unacceptable impacts on other aircraft systems, especially in an emergency situation. Additionally, smoke management requirements prevent the two systems 20, 58 from being permanently combined, In preferred form, the present invention provides an interconnecting duct 84 between ducts 28, 68 of the main and flight deck avionics cooling systems 20, 58.

The interconnecting duct 84 includes an automatic, motor-operated shutoff valve 86. This shutoff valve 86 may be of any standard construction including a valve such as that commonly known and used as an overboard exhaust valve 44. The shutoff valve 86 is normally in a closed position. In a normal mode of operation, no airflow is exchanged through the interconnecting duct 84. Airflow to flight deck avionics 70, 74, 76, 78 is supplied by the flight deck supply fan 60. Cooling airflow to main equipment raok avionics 30, 32, 34 is supplied by a main supply fan 24.

The system of the present invention may operate in either of two backup modes. First, in the event of failure of both fans 60 of the flight deck system 58, the interconnecting shutoff valve 86 is opened so that the fan 24 of the main cooling system 20 can provide airflow through the interconnecting duct 84 and ducts 68 to the flight deck avionics compartments or racks 70, 74, 76, 78. Check valves 62 would prevent back-flow of air through the fans 60 and intake ducts 64, 66. A single fan 24 of the main cooling system 20 would provide decreased, but acceptable, airflow to all avionics compartments. While such decreased airflow would be unacceptable for normal operations, it is adequate for such an emergency situation.

Second, in the event of primary and secondary failure of the main cooling system 20, the shutoff valve 86 would be activated to open the interconnecting duct 84 such that the fan 60 of the flight deck system 58 could supply cooling airflow through the interconnecting duct 84 to critical avionics in the cargo equipment compartment 48.

Figure 2:
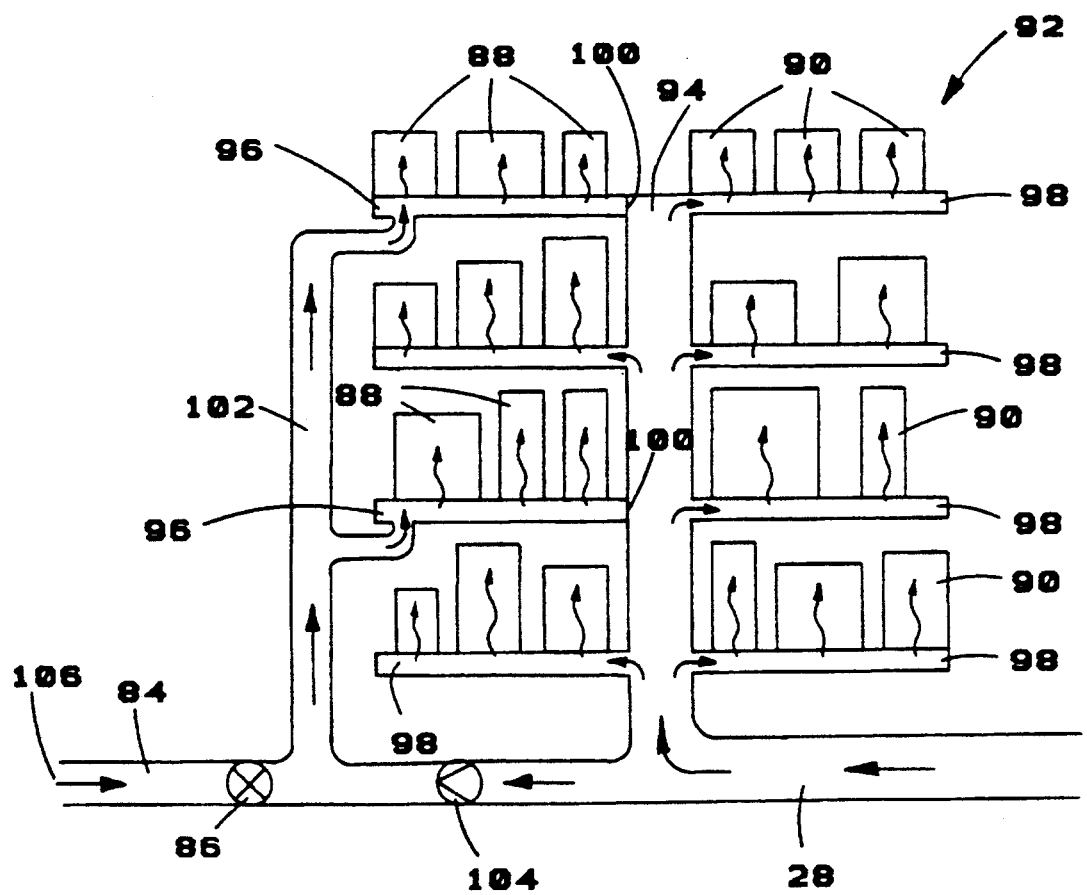
FIG. 2 is a schematic representation of a typical avionics rack modified according to a preferred embodiment of the present invention.

Referring now also to FIG. 2, another aspect of the present invention provides a separation or segregation of critical avionics. As used herein, critical avionics refers to that equipment which requires cooling and is deemed necessary to safe flight and landing of the airplane 10. Avionic equipment units 88, 90 are typically installed on an equipment rack 92. The equipment rack 92 includes generally a main support 94 which acts as a plenum with various horizontal shelves 96, 98 extending therefrom. Various equipment shelves or supports which mount avionic equipment units 88, 90 act as ducts and branch off of the main plenum 94. As illustrated by arrows in FIG. 2, cooling air is normally delivered from the main supply unit 20 through a duct 28 into various branches, such as the main plenum 94 of an equipment rack 92. Cooling air is delivered from the plenum 94 to the various shelf ducts 98 into the avionic units 90, and then is dissipated to ambient or may be recirculated. Certain shelves 96 of the equipment rack 92 may be segregated from the other shelves 98 by closing off (as at 100) the shelf duct from the main plenum 94. Instead, a separate branch 102 is provided off the main duct 28 which is then operably connected to the duct space of the segregated equipment shelves 96. Air flowing into these shelf units 96 flows into critical avionic units 88 and is exhausted to ambient or may be recirculated.

A check valve 104 may be installed in the main duct 28 or one of the branches thereof. This check valve 104 may be of any typical construction, including those 26, 62 which are used in conjunction with supply fans 24, 60. Normally, such a check valve is passive in operation, being mechanically opened by airflow therethrough in the primary direction. The check valve 104 may be closed by a spring, in a well known manner, when airflow is stopped or may be forced to a closed position by reversal of airflow.

The interconnecting duct 84 connects with the main duct 28 or branch duct 102 at a point normally downstream of the check valve 104. In this manner, in an emergency mode caused by failure of the main supply fans 24, the shutoff valve 86 is opened and emergency airflow 106 is provided through the interconnecting duct 84 to the branch duct 102. Flow into the main duct 28 is prevented by the check Valve 104. The emergency or backup airflow is ducted to critical avionics 88, to the exclusion of non-critical avionics 90.

As described, the present invention provides low-weight, high-reliability cooling to two sets of critical avionics, while maintaining cooling system isolation required for smoke control. The interconnecting duct 84 can transport cooling airflow in two opposite directions, depending on failure mode. However, during normal mode of operation, the shutoff valve 86 precludes any smoke entering the equipment bay 48 from entering the flight deck 14 in compliance with federal aviation regulations. Critical equipment in the equipment racks is isolated by means of the check valve 104, which allows third source backup cooling only of essential avionics. The present invention provides a triple redundant backup system in which failure is extremely improbable. The present invention will preclude smoke from entering the flight deck under all statistically possible fire scenarios and will provide backup cooling under all statistically possible cooling failure scenarios.

Many variations in the specific structure and arrangement of the present invention can be made without departing from the spirit and scope of the invention. Therefore, the illustrated and described embodiments are by way of example only, and not intended to be limitive. Instead, patent protection is to be limited only by the following claim or claims, interpreted according to accepted doctrines of claim interpretation, including the doctrine of equivalents.

What is claimed is:

1. In an aircraft having a plurality of compartments to be cooled, a cooling system, comprising:
   a first source of cooling airflow directed through a first duct to a first compartment;
   a second source of cooling airflow directed through a second duct to a second compartment;
   a check valve in said first duct permitting flow from said first source of cooling airflow to said first compartment and preventing a back-flow of air therethrough;
   an interconnecting duct between said first and second ducts, said interconnecting duct connecting to said first duct at a location between said check valve and said first compartment; and
   a shutoff valve in said interconnecting duct operable to open or close airflow therethrough;
   wherein said first and second sources of airflow are isolated each from each other.

2. The cooling system of claim 1, wherein said first and second sources of cooling airflow each include a fan.

3. The cooling system of claim 2, wherein each of said first and second sources of cooling airflow includes two fans, a secondary fan being operable as a backup in the event of failure of a primary fan.

4. The cooling system of claim 1, wherein said first duct includes a plurality of branches, said check valve being located in one of said branches.

5. The cooling system of claim 4, wherein said first compartment includes regions, each said region having cooling airflow supplied by separate branches of said duct.

6. In an aircraft having a plurality of compartments to be cooled, a cooling system, comprising:
   a first source of cooling airflow directed through a first duct to a first compartment;
   a second source of cooling airflow directed through a second duct to a second compartment;
   a check valve in said first duct permitting flow from said first source of cooling airflow to said first compartment and preventing a back-flow of air therethrough;
   an interconnecting duct between said first and second ducts, said interconnecting duct connecting to said first duct at a location between said check valve and said first compartment; and
   a shutoff valve in said interconnecting duct operable to open or close airflow therethrough;
   wherein said first duct includes a plurality of branches, said check valve being located in one of said branches;
   wherein said first compartment includes regions, each having cooling airflow supplied by separate branches of said duct; and
   wherein critical avionics to be cooled are located in a region of said first compartment to which cooling air is supplied by said branch which includes said check valve.

7. In an aircraft having a plurality of compartments to receive airflow, an airflow system, comprising:
   a first means for providing airflow directed through a first duct to a first compartment;
   a second means for providing airflow directed through a second duct to a second compartment;
   a check valve means operably positioned in said first duct to permit flow from said first airflow means to said first compartment and preventing a back-flow of air therethrough;
   a duct means for interconnecting said first and second ducts, said interconnecting duct means connecting to said first duct at a location between said check valve means and said first compartment; and
   said interconnecting duct means including a valve means operable to open or close airflow therethrough;
   wherein said first means draws said airflow from a first source and said second means draws said airflow from a second source, said first and second sources being isolated from each other.

8. The airflow system of claim 7, wherein each of said first and second airflow means each includes a fan.

9. The airflow system of claim 8, wherein each of said first and second airflow means includes two fans a second fan of each airflow means being operable to provide airflow in the event of failure of the first fan of that airflow means.

10. The airflow system of claim 7, wherein airflow is normally provided to said first compartment by said first airflow means and airflow is provided to said second compartment by said second airflow means, said check valve means normally permitting airflow from said first airflow means to said first compartment and said valve means in said interconnecting duct means is normally closed.

11. The airflow system of claim 7, operable in a first emergency mode upon failure of said second airflow means, wherein said valve means in said interconnecting duct means is opened and airflow is also supplied to said second compartment by said first airflow means.

12. In an aircraft having a plurality of compartments to receive airflow, an airflow system, comprising:
a first means for providing airflow directed through a first duct to a first compartment;
a second means for providing airflow directed through a second duct to a second compartment;
a check valve means operably positioned in said first duct to permit flow from said first airflow means to said first compartment and preventing a back-flow of air therethrough;
a duct means for interconnecting said first and second ducts, said interconnecting duct means connecting to said first duct at a location between said check valve means and said first compartment;
said interconnecting duct means including a valve means operable to open or close airflow therethrough; and
operable in a second emergency mode upon failure of said first airflow means, wherein said valve means in said interconnecting duct means is opened and airflow is also supplied to said first compartment by said second airflow means, back-flow of air through said first duct being prevented by said check valve means.

13. The airflow system of claim 12, wherein said first duct includes a plurality of branches said check valve means being operably positioned in one of said branches, said first compartment including regions to which airflow is supplied by separate branches, and critical avionics being located in a region of said first compartment being supplied with airflow by said branch which includes said check valve means.

* * * * *

UNITED STATES PATENT AND TRADEMARK OFFICE
CERTIFICATE OF CORRECTION

PATENT NO. : 5,253,484
DATED : October 19, 1993
INVENTOR(S) : Randal A. Corman and Terry R. Waldron It is certified that error appears in the above-identified patent and that said Letters Patent is hereby corrected as shown below:

Title page, item [57], the Abstract, the 9th line from the bottom, after "source", insert -- of --.

Column 1, line 68, "®f" should be -- of --.
Column 2, line 16, "cf" should be -- of --.
Column 2, line 52, "Wall 12" should be -- wall 12 --.
Column 3, line 8, "3B" should be -- 38 --.
Column 3, line 40, "?0" should be -- 70 --.
Column 4, line 10, "raok" should be -- rack --.
Column 5, line 8, "Valve 104" should be -- valve 104 --.
Column 5, line 14, there is a period after "control".
Column 5, line 25, there is a period after "improbable".
Claim 9, column 6, line 54, there is a comma after "fans".
Claim 13, column 8, line 12, there is a comma after "branches".

Signed and Sealed this

Seventeenth Day of May, 1994

Attest:

BRUCE LEHMAN

Attesting Officer

Commissioner of Patents and Trademarks